United States Patent [19]
Arima et al.

[11] Patent Number: 5,375,042
[45] Date of Patent: Dec. 20, 1994

[54] SEMICONDUCTOR PACKAGE EMPLOYING SUBSTRATE ASSEMBLY HAVING A PAIR OF THIN FILM CIRCUITS DISPOSED ONE ON EACH OF OPPOSITELY FACING SURFACES OF A THICK FILM CIRCUIT

[75] Inventors: Hideo Arima; Kiyoshi Matsui, both of Yokohama; Kenji Takeda, Kamakura, all of Japan

[73] Assignee: Hitachi, Ltd., Tokyo, Japan

[21] Appl. No.: 799,950

[22] Filed: Nov. 29, 1991

[30] Foreign Application Priority Data

Nov. 30, 1990 [JP] Japan .................................. 2-340480

[51] Int. Cl.⁵ ............................................. H05K 1/11
[52] U.S. Cl. ..................... 361/784; 361/748; 361/761; 361/792; 361/810; 174/255; 257/686
[58] Field of Search ............... 361/388, 396, 400, 403, 361/412, 414, 417, 748, 760, 761, 784, 792, 807, 810; 174/255, 257, 263; 257/777, 778, 782, 686

[56] References Cited

U.S. PATENT DOCUMENTS

| | | | |
|---|---|---|---|
| 4,739,448 | 4/1988 | Rowe et al. | 361/386 |
| 4,754,371 | 6/1988 | Nitta et al. | 361/411 |
| 4,910,643 | 3/1990 | Williams | 361/414 |
| 4,959,900 | 10/1990 | de Givry et al. | 29/840 |
| 5,110,664 | 5/1992 | Nakanishi et al. | 428/195 |

FOREIGN PATENT DOCUMENTS 60-83301 of 0000 Japan .
62-122258 of 0000 Japan .

OTHER PUBLICATIONS

Microelectronics Packaging Handbook, Van Nostrand Reinhold (1989), pp. 673–725, "Thin-Film Packaging".

*Primary Examiner*—Leo P. Picard
*Assistant Examiner*—Young Whang
*Attorney, Agent, or Firm*—Antonelli, Terry, Stout & Kraus

[57] ABSTRACT

A semiconductor package and an electronic circuit board in which the semiconductor package is mounted on an external circuit board. The semiconductor package has a substrate assembly and a semiconductor mounted on the substrate, where the substrate assembly is composed of a thick film circuit in the form of a ceramic circuit board and a pair of thin film circuits disposed one on each of opposite surfaces of the thick film circuits. Such a substrate assembly has one surface thereof connected to, i.e. electrically contacting, the semiconductor and an opposing surface thereof adapted to be connected to an external circuit. The thin film circuits of the assembly are formed of a heat-resisting resin and a conducting material.

29 Claims, 8 Drawing Sheets

SEMICONDUCTOR PACKAGE EMPLOYING SUBSTRATE ASSEMBLY HAVING A PAIR OF THIN FILM CIRCUITS DISPOSED ONE ON EACH OF OPPOSITELY FACING SURFACES OF A THICK FILM CIRCUIT

BACKGROUND OF THE INVENTION

1. Field of the Invention

This invention relates to a semiconductor package in which a semiconductor is mounted on a substrate and, more particularly, to an electronic circuit board including a semiconductor package which is high in packaging density, connecting reliability and yield.

2. Description of the Related Art

As great advances have been made in electronics technology such as computer technology in recent years, demands for high density, high function and high performance are on the rise. To this end, various attempts have hitherto been made to improve either semiconductors or substrates on which various electronics components including semiconductors are to be mounted.

Basically, a semiconductor package includes a semiconductor and can accommodate an electrical connection of the terminal of the semiconductor with the terminal of an electronic circuit substrate surface on which the semiconductor package is mounted, and has a function for temporarily or permanently sealing the semiconductor.

In an effort to make this semiconductor high in function and density, there is a trend that the diameter and pitch of connecting pads of the semiconductor should be reduced, There is another trend that the width and pitch of wiring should be reduced in an effort to make an electronic circuit substrate, on which a semiconductor package and various electronics components are to be mounted, high in density. Consequently, a trend has arisen in that the wiring board of a semiconductor package should become high in density.

However, since the substrate of this semiconductor package also has a sealing function as mentioned above, a highly airtight strong substrate, usually a ceramic substrate, has been used.

For production of this ceramic substrate, in general, wiring is formed on unfired ceramic sheets at their surfaces and through holes such as by printing and are then laminated, whereupon the resulting laminated substrate is sintered. During this sintering, the shrinkage coefficient of ceramics varies relatively widely so that a connecting pad on the ceramic substrate and a semiconductor pad to be mounted on the connecting pad will be mislocated (e.g., misaligned) with respect to each other. Also, mislocation would occur between the connecting pad on the substrate on which the semiconductor package is to be mounted, and the connecting pad on the ceramic substrate to be connected with the former connecting pad. Consequently, in the case where connection is made by soldering, incorrect or inadequate connection would occur to lower the yield. Various attempts have been made to avoid this problem; for example, the diameter and pitch of connecting pads are increased, or the size of semiconductors and substrates is reduced. These conventional measures are not suitable for production of high-density substrates.

To this end, a solution has been proposed in which a thin film circuit of polyimide is formed on a ceramic multilayer substrate and then a semiconductor is mounted on the resulting substrate (for example, Unexamined Japanese Patent Publication (KOKAI) No. SHO 62-122258). According to this prior art, since the thin film circuit, like the semiconductor, is formed by photolithography, it is possible to form a fine high-precision pattern so that the precision of a plane position of a pad on which the semiconductor is to be mounted can be increased, thus reducing the possibility of planar mislocation.

A disadvantage of the resulting package is that since the coefficient of linear expansion of polyimide is considerably larger than that of a ceramic substrate, the entire substrate would become warped. As a result, the gap between the substrate and the semiconductor varies locally. Further, on the back surface of the package, planar mislocation would not be eliminated.

With this prior method, it is impossible to prevent any displacement between a semiconductor package and a semiconductor and any displacement between the semiconductor package and an electronic circuit board on which the semiconductor package is to be mounted, so that a high-density semiconductor package and even a high-density electronic circuit board cannot be realized.

SUMMARY OF THE INVENTION

It is, therefore, an object of this invention to provide a high-packaging-density, high yield and high-connecting-reliability semiconductor package which enables positional matching (e.g., alignment) between a semiconductor and a semiconductor package, and positional matching between the semiconductor package and an external circuit board.

According to a first aspect of the invention, there is provided a semiconductor package having a substrate and a semiconductor mounted on the substrate assembly, where the substrate assembly includes a thick film circuit in the form of a ceramic circuit board, and a pair of thin film circuits disposed one on each of opposite surfaces of the thick film circuit, one surface being connected to the semiconductor and the other surface being adapted to be connected to an external circuit, the thin film circuits being made of a heat-resisting resin and a conductive material.

According to a second aspect of the invention, there is provided an electronic circuit board in which a semiconductor package is mounted on an external circuit board, the semiconductor package having a substrate assembly and a semiconductor mounted on the substrate assembly, wherein the substrate assembly comprises a thick film circuit in the form of a ceramic circuit board, and a pair of thin film circuits located one on each of opposite surfaces of the thick film circuit, one surface being connected to the semiconductor and the other surface being adapted to be connected to an external circuit, the thin film circuits being made of a heat-resisting resin and a conductive material.

Preferably, the external circuit board comprises a thick film circuit and a thin film circuit, the thin film circuit being located on one surface of the thick film circuit which surface is connected with the semiconductor package. More preferably, the external circuit board comprises a thick film circuit and a pair of thin film circuits, one of said thin film circuits being located on one surface of said thick film circuit which surface is connected with said semiconductor package and the other one of said thin film circuits being located on a back surface of said thick film circuit.

The ceramic circuit boards in the semiconductor package and the external circuit are made from a ceramic material and a conductive material. The ceramic material may be a heat-resisting ceramic, such as mullight or alumina, a glass ceramic composed of heat-resisting ceramic powder and glass, or glass. The conductive material may be tungsten, copper, molybdenum, nickel, silver/palladium, gold or platinum.

The thin film circuits in both the semiconductor package and the external circuit are formed of a heat-resisting resin and a conductive material by thin film making technology. The heat-resisting resin may be a heat-resisting organic insulating material such as polyimide or Teflon (trade name).

The thin film making technology is a technology of transferring or describing a predetermined high-precision pattern using electron beam or light, according to which a very precise pattern can be formed without mislocation. The thin film circuit on the electronic circuit board may be formed by patterning a conductive film or an organic insulating film by electron beam or light.

For connecting a semiconductor and a thin film circuit in the semiconductor package, the connecting pad of the semiconductor chip and the connecting pad of the thin film circuit are connected with each other such as by soldering. Likewise, for connecting the thin film circuit formed on the back surface of the semiconductor package with the external circuit, the connecting pad on the surface connecting layer of the backside thin film circuit is connected with the connecting pad of the external circuit such as by soldering.

A commercially available conductive paste may be used as a substitute for solder.

With this arrangement, since the semiconductor and the substrate assembly in the semiconductor package are connected with each other via the thin film circuit, it is possible to form the connecting pad of the semiconductor precisely in position. Likewise, since the semiconductor package and the external circuit are connected with each other via the thin film circuit, it is possible to form the connecting pad of the external circuit precisely in position. If the connecting surface layer of the external circuit is also in the form of a thin film circuit, an improved connection can be achieved.

As a result, the positional matching on the semiconductor mounting side and the positional matching on the electronic circuit board can be achieved with ease, thus preventing any occurrence of incorrect connection due to mislocation.

Further, if a thin film circuit was formed on only one surface of the substrate assembly in the semiconductor package as conventional, the substrate assembly would have been curved, i.e. warped into a curved shape, due to the difference in coefficient of linear expansion between the organic insulating film of the thin film circuit and the ceramic circuit board. In this invention, since a pair of thin film circuits are formed one on each of opposite surfaces of the substrate assembly to cancel each other's influence, it is possible to minimize curving.

Also in the electronic circuit board, partly since the external circuit board is composed of a thick film circuit in the form of a ceramic circuit board and a pair of thin film circuits are formed of a heat-resisting resin and a conductive material, and partly since one thin film circuit is disposed not only on the semiconductor-package-side surface of the external circuit board but also on the backside surface of the thick film circuit, it is also possible to minimize curving of the external circuit board.

DETAILED DESCRIPTION OF THE PREFERRED EMBODIMENTS

EMBODIMENT 1

(Semiconductor Package)

Figure 1:
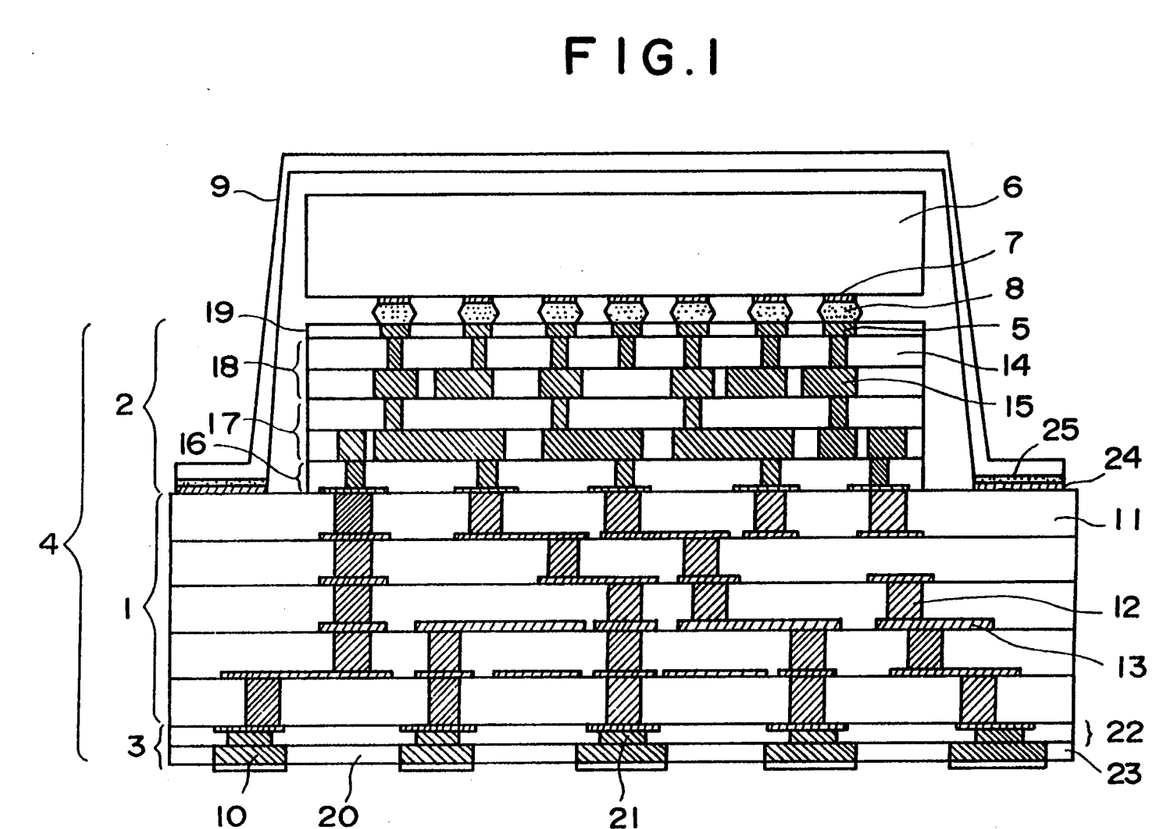
FIG. 1 is a cross-sectional view showing a semiconductor package according to a first embodiment of this invention.

FIG. 1 shows a semiconductor package according to a first embodiment of this invention. In FIG. 1, a substrate assembly 4 which comprises a ceramic circuit board 1, a thin film circuit 2 formed on one surface of the ceramic circuit board 1, and another thin film circuit 3 formed on the other surface of the ceramic circuit board 1. On a connecting pad 5 of the thin film circuit 2, a semiconductor chip 6 is mounted via a connecting pad 7 thereof and solder 8 and is sealed with a cap 9 of kovar. To mount this semiconductor package on an electronic circuit board, a connecting pad 10 of the thin film circuit 3 on the back surface of the package is connected to a connecting pad on the electronic circuit board via solder.

The ceramic circuit board 1 includes five layers of mullite layer 11. In each mullite layer 11, multiple via holes 12 are formed. Each via hole 12 is a through hole filled with tungsten paste. On the surface of each mullite layer 11, an inner layer wiring conductor 13 is printed with tungsten paste. These mullite layer 11, five in total, are placed one over another in register using guide holes (not shown) formed respectively in four corners of each mullite layer 11 and are pressurized at 120° C. to provide a laminate. This laminate is heated at 1640° C. in hydrogen atmosphere. Thus the ceramic circuit board 1 has been produced. The pitch of via holes 12 of the ceramic layer is 450 μm.

The thin film circuit 2 on the ceramic circuit board 1 is composed of polyimide resin 14, which has a low dielectric constant, forming an insulating layer, and copper conductors 15. Thus this thin film circuit 2 includes, in the order from the side of the ceramic circuit board 1, a matching layer 16 matching with the thick film circuit of the ceramic circuit board, a horizontal (X) wiring layer 17, a vertical (Y) wiring layer 18, and a surface connecting layer 19. The wiring layer 17 is a combination of an X layer and a via hole layer, and the wiring layer 18 is a combination of a Y layer and a via hole layer. The polyimide film of the individual layer was produced by spin-coating polyimide varnish over the layer and then baking the coated layer at 370° C. in hydrogen atmosphere for one hour. Grooves were formed on this polyimide film by dry etching. The copper conductors 15 were formed by non-electrolytic plating. The surface of the connecting pad 5 of the connecting surface layer 19 are plated with nickel and gold.

The thin film circuit 3 on the back surface of the ceramic circuit board 1 is similar in construction to the thin film circuit 2 and is produced in the same method as the thin film circuit 2. Namely, the thin film circuit 3 is composed of polyimide resin 20, which has a low dielectric constant, forming an insulating layer, and copper conductors 21. The thin film circuit 3 includes a total of two layers, i.e. a matching layer 22 matching with ceramic circuit board and a connecting surface layer 23. Grooves were formed on this polyimide film by dry etching. The copper conductors were formed by copper plating. The surface of the connecting pad 10 of the connecting surface layer 23 is plated with nickel and gold.

For electrical connection between the connecting pad 5 of the thin film circuit 2 of the substrate assembly 4 and the connecting pad 7 of the semiconductor chip 6 to be mounted on the upper side of the substrate assembly, high-temperature solder 8 was used. Namely, high-temperature solder was applied over the surfaces of the respective connecting pads 5, 7, whereupon these two connecting pads 5, 7, with their portions kept in contact with each other, were heated at about 350° C. so that the high-temperature solder was melted progressively from its surface to finally achieve perfect welding.

A solder-sealed portion 24 on the surface of the ceramic circuit board 1 is a tungsten conductor plated with nickel and gold. Medium or high temperature solder 25 was placed on the solder-sealed portion 24, whereupon the resulting solder-sealed portion 24 was heated at about 300° C. to connect a kovar sealing cap 9 thereto to complete a semiconductor package.

(Electronic Circuit Board)

Figure 2:
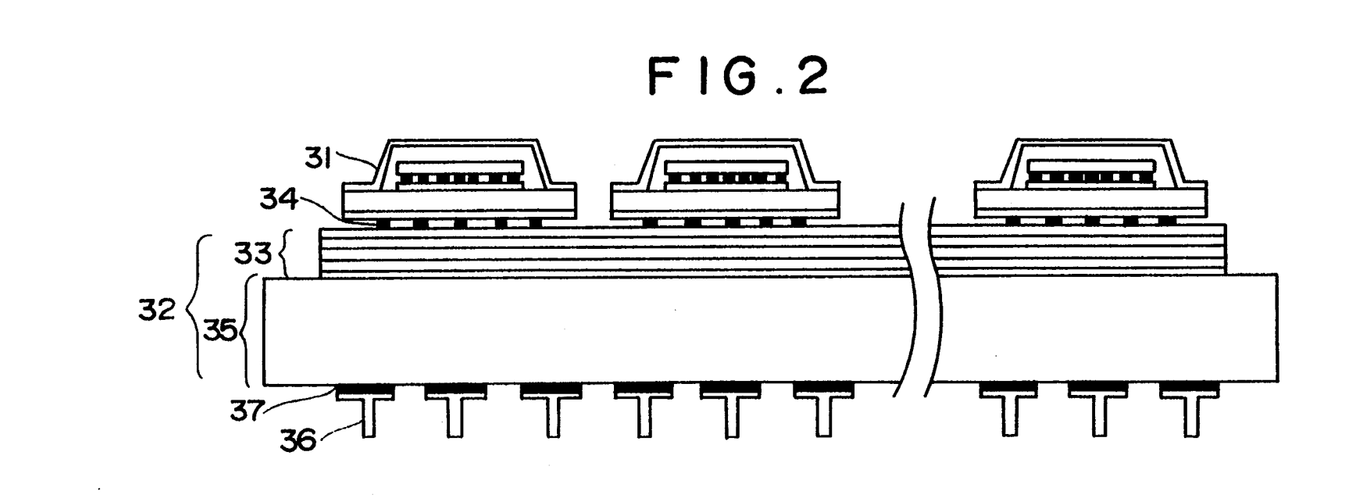
FIG. 2 is a cross-sectional view showing an electronic circuit board on which the semiconductor package of FIG. 1 is mounted.

FIG. 2 shows an electronic circuit board in which 9 rows and 9 columns and hence a total of 81 semiconductor packages 31 produced in the foregoing manner are mounted on a circular board 32.

The circuit board 32 on which the semiconductor packages 31 is mounted is a composite substrate of a thick film circuit and a thin film circuit. This board 32 has a thin film circuit 33 on the semiconductor-package mounting side. When mounting the semiconductor packages on the composite substrate, low-temperature solder 34 was used at about 200° C. The back surface of the composite substrate is a thick film circuit 35. The thick film circuit 35 and the thin film circuit 33 are produced in the same manner as the substrate assembly 4 of the semiconductor package. The thin film circuit 33 is a thin film multilayer composed of five wiring layers, each of which includes insulating regions of polyimide resin and copper conductors. The thick film circuit 35 is a thick film multilayer composed of thirty wiring layers, each of which includes insulating regions of mullite and tungsten conductors. To the back surface of the substrate, namely, to the back surface of the thick film circuit 35, pins 36 for connecting the substrate to an external printed board are connected by medium or high temperature solder 37 immediately before mounting the semiconductor package 31 on the circuite board 32.

(Electronic Module, Electronic Machine)

Figure 3:
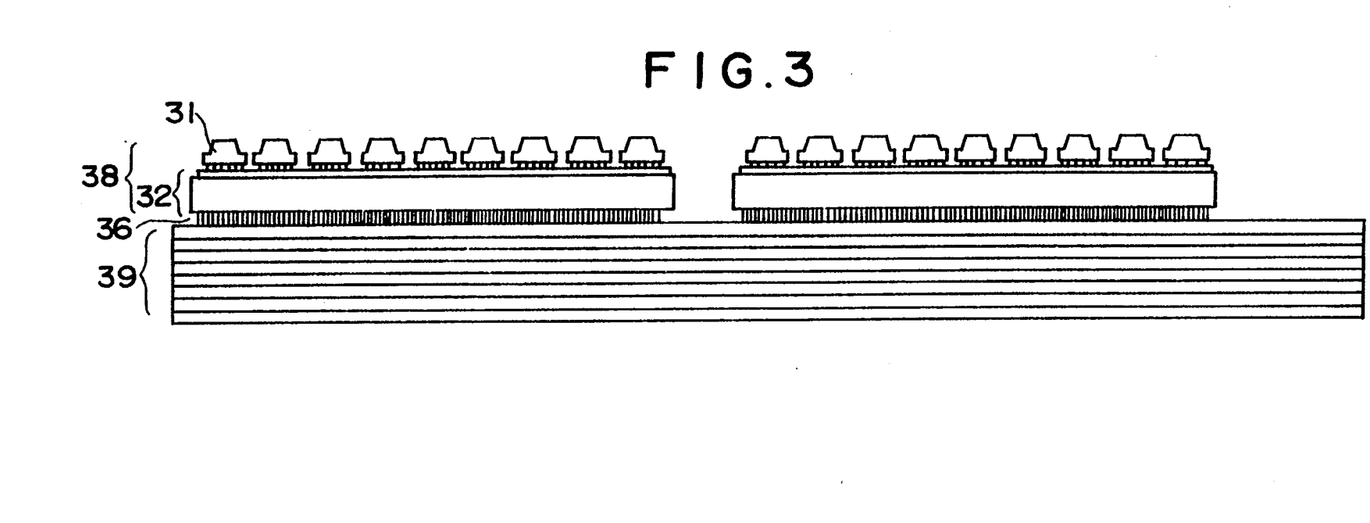
FIG. 3 is a cross-sectional view showing an electronic module on which the electronic circuit board of FIG. 2 is mounted.

FIG. 3 shows a module in which four electronic circuit boards 38 produced in the foregoing manner are mounted on a printed board 39.

The printed board 39 and the electronic circuit board 38 are connected with each other by inserting the pins 36 in holes of the printed board 39. In FIG. 3, reference numeral 31 designates a semiconductor package, and 32 designates a circuit board which is a composite of a thick film circuit and a thin film circuit.

A medium-sized computer using this electronic module operated excellently.

EMBODIMENT 2

(Semiconductor Package)

Figure 4:
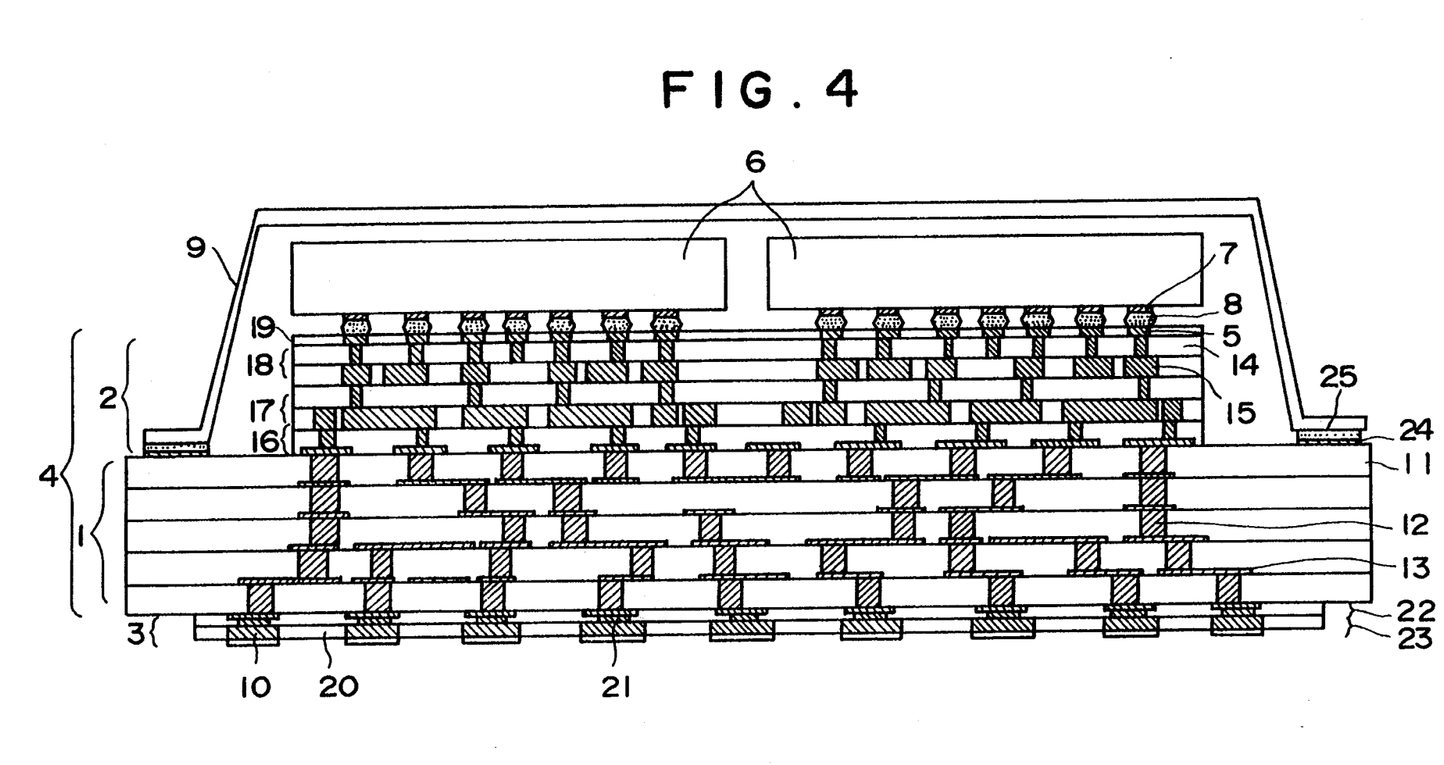
FIG. 4 is a cross-sectional view showing a semiconductor package according to a second embodiment.

FIG. 4 shows a semiconductor package according to a second embodiment of the invention. A thick-film-and-thin-film composite substrate assembly 4 has a thin film circuit 2 formed on one surface of a ceramic circuit board 1 and a thin film circuit 3 formed on the other surface of the ceramic circuit board 1. On a connecting pad 5 of the thin film circuit 2, two semiconductor chips 6 are mounted via a connecting pad 7 thereof and solder 8 and are sealed with a cap 9 of kovar. To mount this semiconductor package on a circuit board, a connecting pad 10 of the thin film circuit 3 on the back surface of the package is connected to a connecting pad on the circuit board via solder.

The ceramic circuit board 1 is composed of five mullite layers 11, via holes 12 filled with a tungsten conductor, and tungsten conductors 13. This ceramic circuit board 1 was produced in the same method as Embodiment 1. However, the circuit details of this embodiment are different from Embodiment 1.

The thin film circuit 2 on the ceramic circuit board 1 is composed of polyimide resin 14, which has a low dielectric constant, forming an insulating layer, and copper conductors 15. This thin film circuit 2, like Embodiment 1, includes a matching layer 16 matching with the thick film circuit of the ceramic circuit board, a horizontal (X) wiring layer 17, a vertical (Y) wiring layer 18, and a surface connecting layer 19. The producing method of these layers is similar to Embodiment 1 except the area of the substrate assembly and the circuit details.

The thin film circuit 3 on the back surface of the ceramic circuit board 1 is similar in construction and method of production to Embodiment 1. Namely, the thin film circuit 3 is composed of polyimide resin 20, which has a low dielectric constant, forming an insulating layer, and copper conductors 21.

Likewise in Embodiment 1, for electrical connection between the connecting pad 5 of the thin film circuit 2 of the substrate 4 and the connecting pad 7 of the semiconductor chip 6 to be mounted on the upper side of the substrate assembly 4, high-temperature solder 8 was used. Medium or high temperature solder 25 was placed on the solder-sealed portion 24 on the surface of the ceramic circuit board 1, whereupon the resulting solder-sealed portion 24 was heated at about 200° C. to connect a kovar sealing cap 9 thereto to complete a semiconductor package.

(Electronic Circuit Board)

Figure 5:
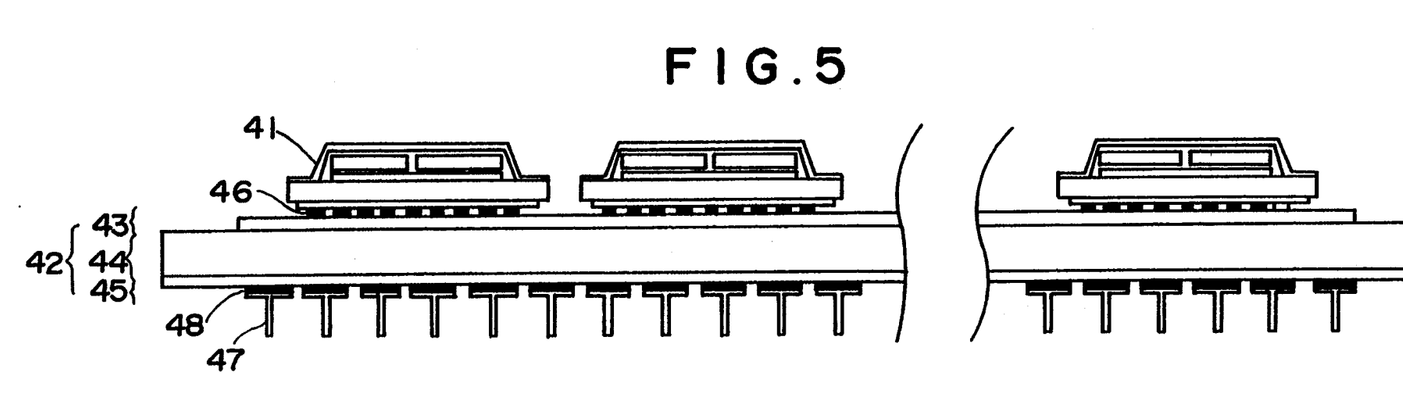
FIG. 5 is a cross-sectional view showing an electronic circuit board on which the semiconductor package of FIG. 4 is mounted.

FIG. 5 shows an electronic circuit board in which 4 rows and 4 columns and hence a total of 16 semiconductor packages 41 produced in the foregoing manner are mounted on a circuit board 42.

The electronic circuit board 42 on which the semiconductor packages 41 is mounted is a composite substrate having a thick film circuit and a pair of thin film circuits. This board 42 has a thin film circuit 43 on the semiconductor-package mounting side. The semiconductor package 41 was connected to the connecting pad of the thin film circuit 43 by low-temperature solder 46. Under the thin film circuit 43, there is a thick film circuit 44, and under this thick film circuit 44 and hence under the back surface of the circuit board 42, there is a thin film circuit 45. To the thin film circuit 45 on back surface of the board 42, pins 47 for connecting the board to an external printed board were connected by medium or high temperature solder 48 immediately before mounting the semiconductor package on the board 42.

The thick and thin film circuits 44, 43, 45 of the composite substrate 42 were produced in the same method as the substrate assembly 4 of the above-mentioned semiconductor package. The thin film circuit 43 is a thin film multilayer composed of five wiring layers, each of which includes insulating regions of polymide resin and copper conductors. The thick film circuit 44 is a thick film multilayer composed of thirty wiring layers, each of which includes insulating regions of mullite and tungsten conductors. The thin film circuit 45 on the back surface of the substrate is a thin film multilayer composed of two wiring layers, each of which includes insulating regions of polyimide resin and copper conductors.

(Electronic Module, Electronic Machine)

Figure 6:
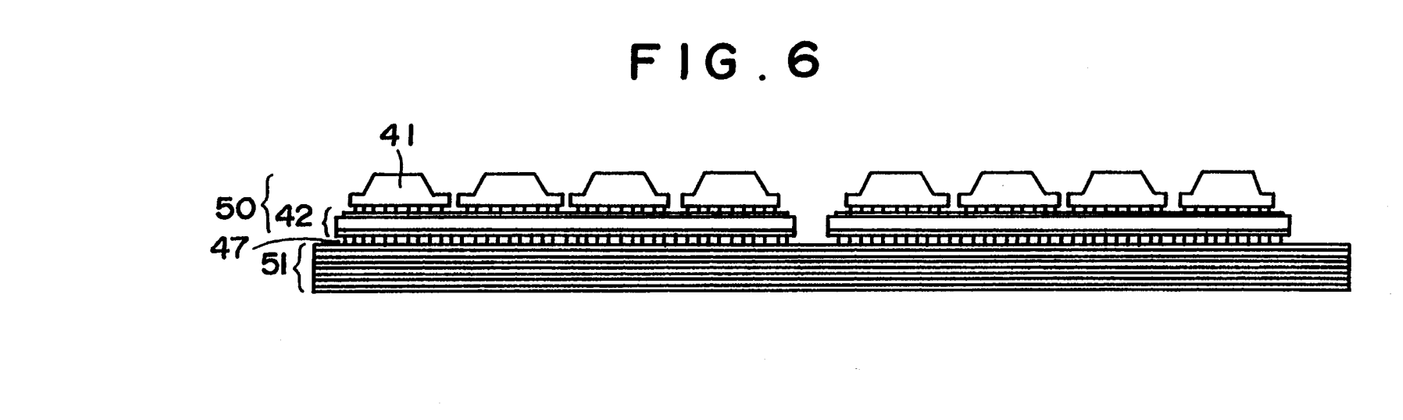
FIG. 6 is a cross-sectional view showing an electronic module on which the electronic circuit board of FIG. 5 is mounted.

FIG. 6 shows a module in which four electronic circuit boards 50 produced in the foregoing manner are mounted on a printed board 51.

The printed board 51 and the electronic circuit board 50 are connected with each other by inserting the pins 47 in holes of the printed board 51. In FIG. 6, reference numeral 41 designates a semiconductor package, and 42 designates a circuit board which is a comosite of a thick film circuit and a pair of thin film circuits.

A medium-sized computer using this electronic module operated excellently.

EMBODIMENT 3

(Semiconductor Package)

Figure 7:
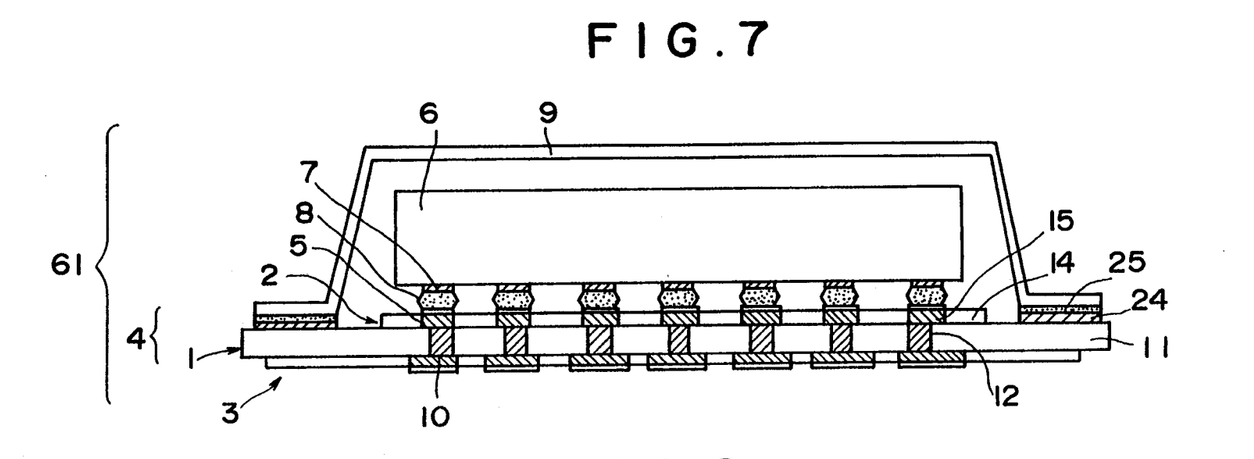
FIG. 7 is a cross-sectional view showing a semiconductor package according to a third embodiment.

FIG. 7 shows a semiconductor package according to a third embodiment of this invention. In FIG. 7, a substrate assembly 4 which comprises a ceramic circuit board 1, a thin film circuit 2 formed on one surface of the ceramic circuit board 1, and another thin film circuit 3 formed on the other surface of the ceramic circuit board 1. On a connecting pad of the thin film circuit 2, a semiconductor chip 6 is mounted via a connecting pad 7 thereof and solder 8 and is sealed with a cap 9 of kovar. To mount this semiconductor package on an electronic circuit board, a connecting pad 10 of the thin film circuit 3 on the back surface of the package is connected to a connecting pad on the electronic circuit board via solder.

The ceramic circuit board 1 is composed of a single mullite layer 11 having through holes filled with a tungsten conductor. The producing method of the ceramic circuit board 1 is the same method as Embodiment 1.

The thin film circuit 2 on the ceramic circuit board 1 is in the form of a single layer composed of polyimide resin 14, which has a low dielectric constant, for insulation, and copper conductors 15. The thin film circuit 2 was produced in the same method as Embodiment 1.

Likewise, the thin film circuit 3 on the ceramic circuit board 1 is in the form of a single layer composed of polyimide resin, which has a low dielectric constant, for insulation, and copper conductors. The copper conductors also serves as a connecting pad.

The surface of the thin film circuit 2 of the substrate assembly 4 and the semiconductor chip 6 were connected to each other by high-temperature solder 8 in the same method as Embodiment 1. Medium or high temperature solder 25 was placed on the solder-sealed portion 24, whereupon the resulting solder-sealed portion 24 was heated at about 200° C. to connect a kovar sealing cap 9 thereto to complete a semiconductor package 61.

(Electronic Circuit Board)

Figure 8:
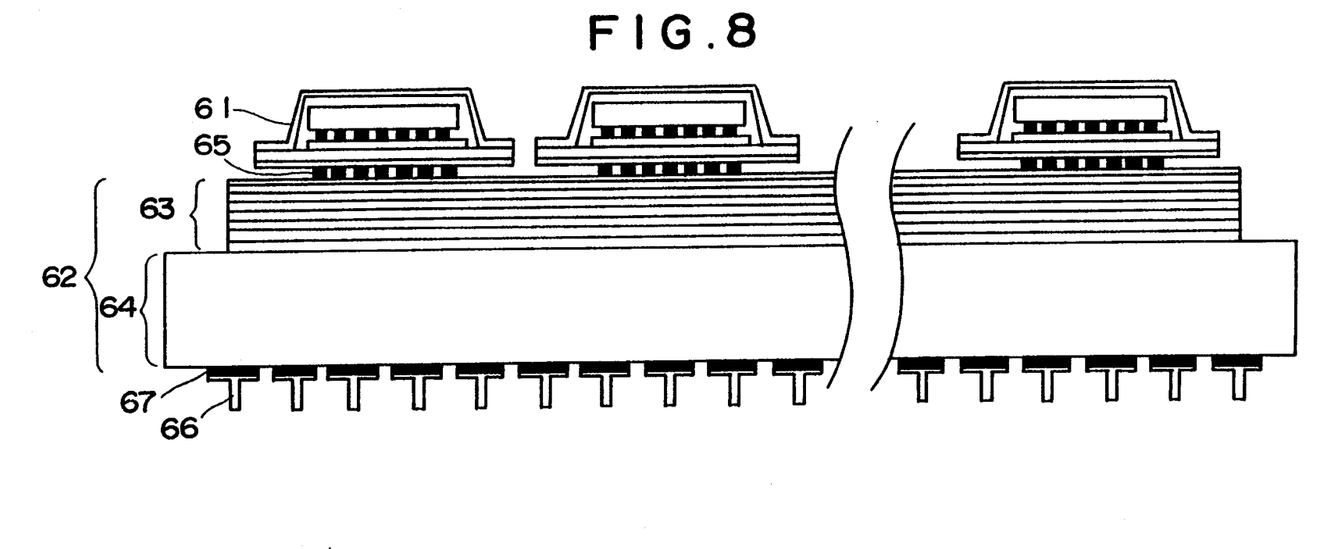
FIG. 8 is a cross-sectional view showing an electronic circuit board on which the semiconductor package of FIG. 7 is mounted.

FIG. 8 shows an electronic circuit board in which 9 rows and 9 columns and hence a total of 81 semiconductor packages 61 produced in the foregoing manner are mounted on a circuit board 62.

The circuit board 62 on which the semiconductor packages 61 are mounted is a composite substrate having a thick film circuit and a thin film circuit. This board 62 has a thin film circuit 63 on the semiconductor-package mounting side. When mounting the semiconductor packages on the composite substrate, low-temperature solder 65 was used. Under the thin film circuit 63, there is a thick film circuit 64. To the back surface of the thick film circuit 64, pins 66 for connecting the substrate to a printed board were connected by medium or high temperature solder 67 immediately before mounting the semiconductor package 61 on the circuit board 62.

(Electronic Module, Electronic Machine)

Figure 9:
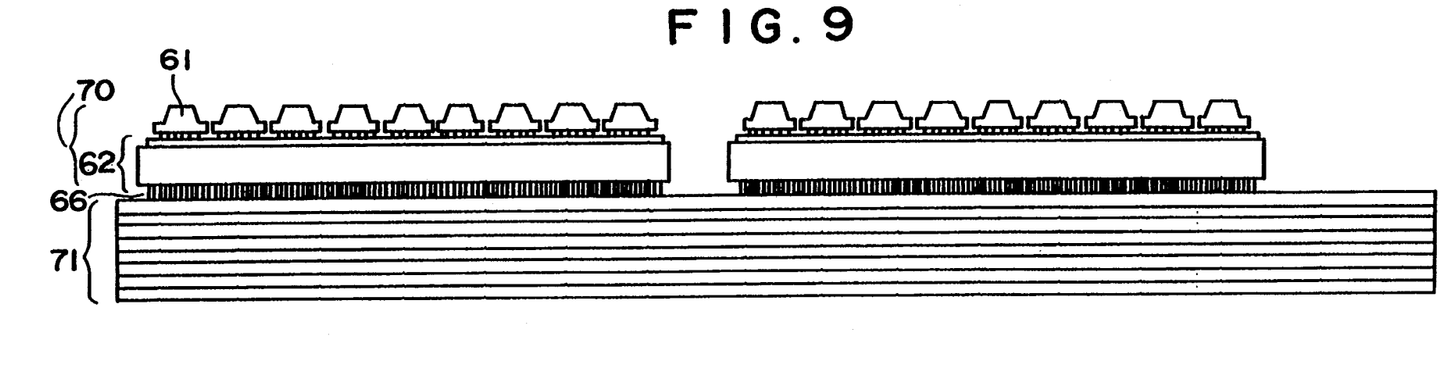
FIG. 9 is a cross-sectional view showing an electronic module on which the electronic circuit board of FIG. 8 is mounted.

FIG. 9 shows a module in which four electronic circuit boards 70 produced in the foregoing manner are mounted on a printed board 71.

The printed board 71 and the electronic circuit board 70 are connected with each other by inserting the pins 66 in holes of the printed board 71. In FIG. 9, reference numeral 61 designates a semiconductor package, and 62 designates a circuit board which is a composite of a thick film circuit and a thin film circuit.

A medium-sized computer using this electronic module operated excellently.

EMBODIMENT 4

(Semiconductor Package)

Figure 10:
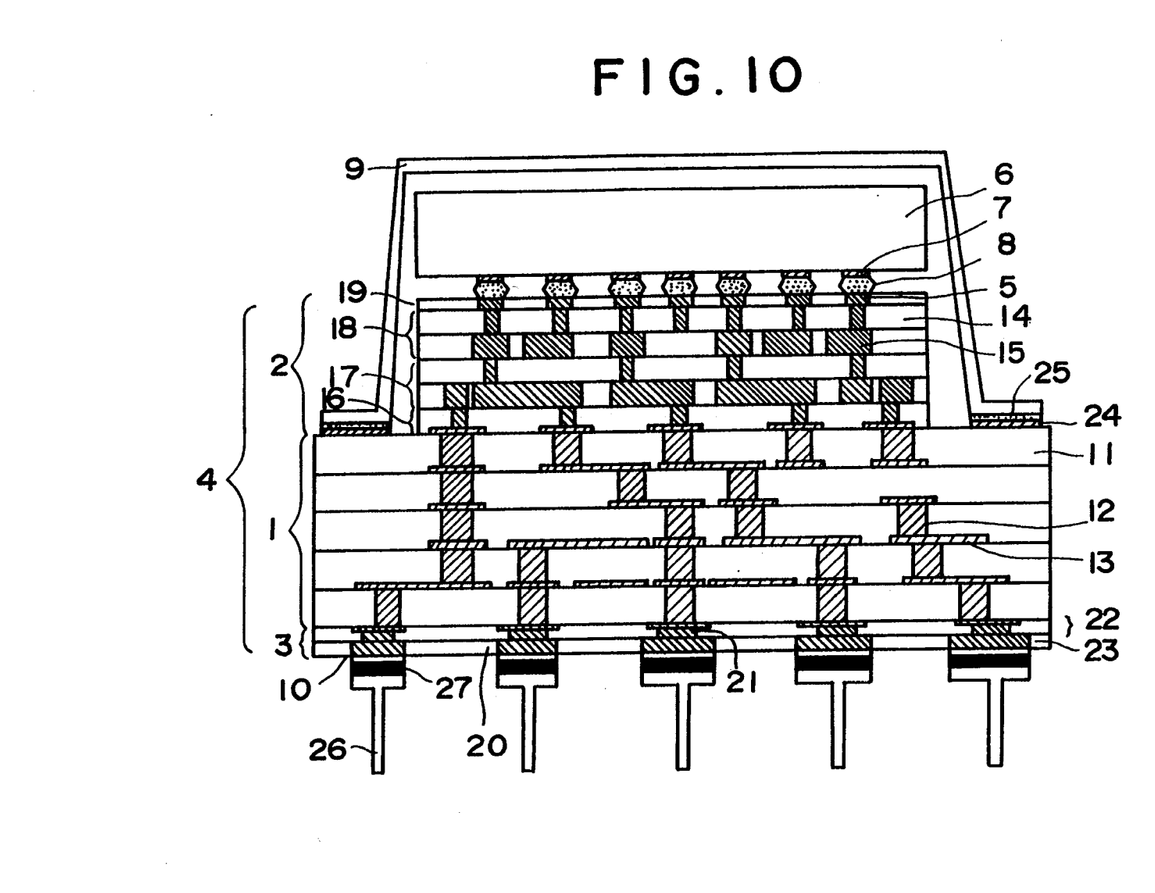
FIG. 10 is a cross-sectional view showing a semiconductor package according to a fourth embodiment.

FIG. 10 shows a semiconductor package according to a fourth embodiment of this invention. In FIG. 10, a substrate assembly 4 which comprises a ceramic circuit board 1, a thin film circuit 2 formed on one surface of the ceramic circuit board 1, and another thin film circuit 3 formed on the other surface of the ceramic circuit board 1. On a connecting pad 5 of the thin film circuit 2, a semiconductor chip 6 is mounted via a connecting pad 7 thereof and solder 8 and is sealed with a cap 9 of kovar. To mount this semiconductor package on an electronic circuit board, pins 26 are connected to a connecting pad 10 of the thin film circuit 3 on the back surface of the package via medium or high temperature solder 27.

The ceramic circuit board 1 is composed of five layers of mullite layers 11 and a tungsten conductor 12. The ceramic circuit board 1 is produced in the same method as Embodiment 1.

The thin film circuit 2 on the ceramic circuit board 1 is composed of polyimide resin 14, which has a low dielectric constant, forming an insulating layer, and copper wires 15. This thin film circuit 2, like Embodiment 1, includes a matching layer 16 matching with the thick film circuit of the ceramic circuit board, a horizontal (X) wiring layer 17, a vertical (Y) wiring layer 18, and a surface connecting layer 19. These layers were produced in the same method as Embodiment 1.

The thin film circuit 3 on the back surface of the ceramic circuit board 1 is similar in construction and method of production to Embodiment 1. Namely, the thin film circuit 3 is composed of polyimide resin 20, which has a low dielectric constant, forming an insulating layer, and copper wires 21.

Likewise in Embodiment 1, for electrical connection between the connecting pad 5 of the thin film circuit 2 of the substrate assembly 4 and the connecting pad 7 of the semiconductor chip 6 to be mounted on the upper side, high-temperature solder 8 was used. With medium or high temperature solder 27 placed on the connecting pad 10 on the back surface of the ceramic circuit board 1, pins 26 were connected to the connecting pad 10 by heating at about 300° C. Further, medium or high temperature solder 25 was placed on the solder-sealed portion 24 on the surface of the ceramic circuit board 1, whereupon the resulting solder-sealed portion 24 was heated at about 200° C. to connect a kovar sealing cap 9 thereto to complete a semiconductor package.

(Electronic Module, Electronic Machine)

Figure 11:
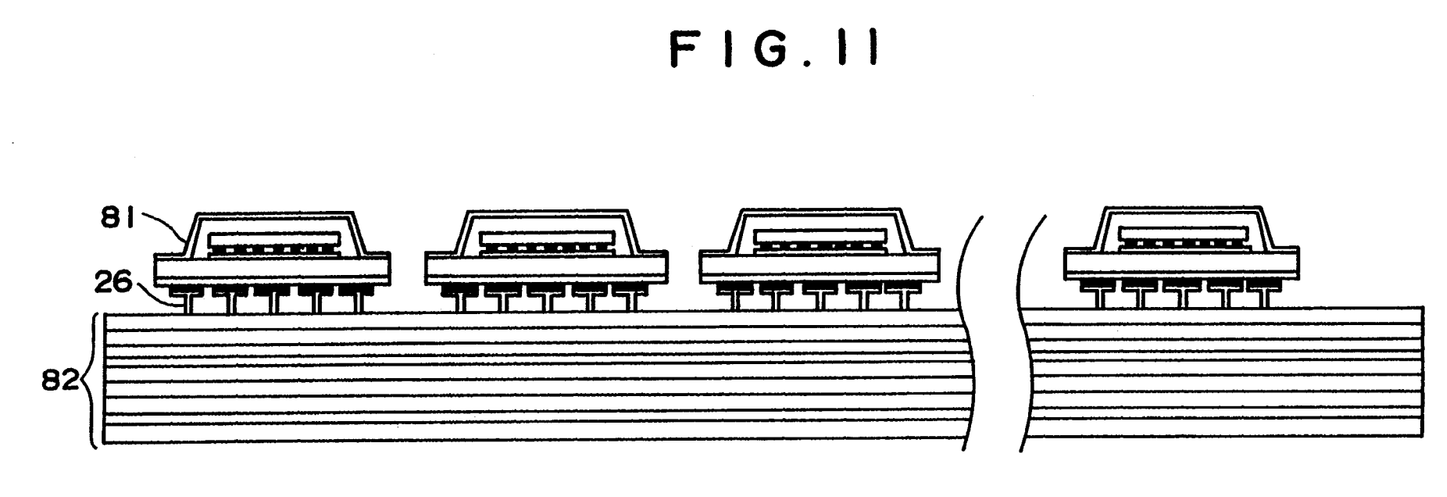
FIG. 11 is a cross-sectional view showing electronic module on which the semiconductor package of FIG. 10 is mounted.

FIG. 11 shows an electronic module in which 9 rows and 9 columns and hence a total of 81 semiconductor packages 81 produced in the above-mentioned manner are mounted on a printed board 82.

The printed board 82 with the semiconductor packages 81 is in the form of a multilayer including nine wiring layered.

A medium-sized computer using this electronic module operated excellently.

Following are the advantageous results of this invention:

(1) Since the position of the connecting pad of the semiconductor package and the position of the connecting pad of the external circuit board can be three-dimensionally precisely matched with each other as compared to the conventional system, it is possible to produce a semiconductor package having a high packaging density. When mounting a semiconductor in a package and even when mounting the package on an external circuit board, positional matching can be performed with ease. Thus it is possible to minimize incorrect connections, such as connecting with a wrong pad adjacent to the target pad or failing to connect with the target pad, so that high-yield production can be realized. Further, since there is no three-dimensional displacement at the connecting portions, the solder at the connecting portions would kept in proper posture, thus guaranteeing an improved degree of connection reliability.

(2) Since in the semiconductor package, the back surface of the ceramic circuit board also is coated with a soft film of an organic material such as polyimide, it is possible to improve the shockproof feature of the package.

(3) When the ceramic circuit board of the semiconductor package is to be formed of a thin ceramic sheet or even when the moisture-proof feature of the package is inadequate as gaps develop between ceramic granules due to insufficient sintering of ceramic, each of the front and back surfaces of the substrate is covered with a thin film circuit, thus guaranteeing an adequate degree of moisture-proofness of the package.

What is claimed is:

1. A semiconductor package having a substrate assembly and a semiconductor mounted on said substrate assembly, said substrate assembly comprising:

a thick film circuit in the form of a ceramic circuit board; and a pair of thin film circuits disposed one on each of a pair of oppositely facing surfaces of said thick film circuit, wherein one of said oppositely facing surfaces of said thick film circuit is electrically connected to said semiconductor and the other of said oppositely facing surfaces is disposed for electrical connection to an external circuit, and wherein said thin film circuits are made of a heat-resisting resin and a conducting material.

2. The semiconductor package according to claim 1, wherein said semiconductor includes at least one semiconductor chip, each one of said at least one semiconductor chip is electrically connected to said substrate assembly via solder bonding of connecting pads which are provided at a contacting surface of said semiconductor chip and at that one of said pair of thin film circuits which is facing said semiconductor chip.

3. The semiconductor package according to claim 2, wherein the other one of said thin film circuits, included in said substrate assembly, is provided with connecting pads for effecting electrical contact with said external circuit.

4. The semiconductor package according to claim 3, wherein electrical connections between connecting pads on a surface of said substrate assembly, electrically contacting said at least one semiconductor chip, and connecting pads on an opposite surface thereof, for electrically contacting said external circuit, are provided by using conductors and through holes for effecting inter-layer electrical connections in said thin film circuits and said ceramic circuit board.

5. The semiconductor package according to claim 4, wherein said ceramic circuit board is comprised of a multi-layer laminate of a heat-resisting ceramic material and conductive material.

6. The semiconductor package according to claim 5, wherein said heat-resisting resin material is a polyimide resin.

7. The semiconductor package according to claim 6, wherein said at least one semiconductor chip consists of a single semiconductor chip.

8. The semiconductor package according to claim 6, wherein said at least one semiconductor chip includes a number of semiconductor chips greater than one.

9. The semiconductor package according to claim 6, wherein said at least one semiconductor chip is sealed with a sealing cap.

10. The semiconductor package according to claim 1, wherein said at least one semiconductor chip is sealed with a sealing cap.

11. An electronic circuit board in which a semiconductor package is mounted on an external circuit board, said package having a substrate assembly and a semiconductor mounted on said substrate assembly, and said substrate assembly comprising:

a thick film circuit in the form of a ceramic circuit board; and a pair of thin film circuits located one on each of a pair of oppositely facing surfaces of said thick film circuit, wherein one of said oppositely facing surfaces of said thick film circuit is electrically connected to said semiconductor and the other of said oppositely facing surfaces is disposed for electrical connection to an external circuit, and wherein said thin film circuits are made of a heat-resisting resin and a conductive material.

12. The electronic circuit board according to claim 11, wherein said external circuit board comprises a thick film circuit and a thin film circuits, said thin film circuit of said external circuit board being located on a surface of said thick film circuit thereof facing said semiconductor package.

13. The electronic circuit board according to claim 12, wherein said semiconductor includes at least one semiconductor chip, each one of said at least one semiconductor chip is electrically connected to said substrate assembly via solder bonding of connecting pads which are provided at a contacting surface of said semiconductor chip and at that one of said pair of thin film circuits which is facing said semiconductor chip.

14. The electronic circuit board according to claim 12, wherein in both said substrate assembly and external circuit board said ceramic circuit board is comprised of a multi-layer laminate of a heat-resisting ceramic material and conductive material and all of said thin film circuits are formed of heat-resisting resin and conducting material.

15. The electronic circuit board according to claim 14, wherein said heat-resisting resin material is a polyimide resin.

16. The electronic circuit board according to claim 11, wherein said external circuit board comprises a thick film circuit and a pair of thin film circuits, one of said thin film circuits of said external circuit board being located on a first surface of said thick film circuit thereof facing said semiconductor package and the other one of said thin film circuits of said external circuit board being located on a second, oppositely facing surface of said thick film circuit thereof.

17. The electronic circuit board according to claim 16, wherein said semiconductor includes at least one semiconductor chip, each one of said at least one semiconductor chip is electrically connected to said substrate assembly via solder bonding of connecting pads which are provided at a contacting surface of said semiconductor chip and at that one of said pair of thin film circuits which is facing said semiconductor chip.

18. The electronic circuit board according to claim 16, wherein in both said substrate assembly and external circuit board said ceramic circuit board is comprised of a multi-layer laminate of a heat-resisting ceramic material and conductive material and all of said thin film circuits are formed of heat-resisting resin and conducting material.

19. The electronic circuit board according to claim 18, wherein said heat-resisting resin material is a polyimide resin.

20. The electronic circuit board according to claim 11, wherein said semiconductor includes at least one semiconductor chip, each one of said at least one semiconductor chip is electrically connected to said substrate assembly via solder bonding of connecting pads which are provided at a contacting surface of said semiconductor chip and at that one of said pair of thin film circuits which is facing said semiconductor chip.

21. The electronic circuit board according to claim 11, wherein said ceramic circuit board is comprised of a multi-layer laminate of a heat-resisting ceramic material and conductive material.

22. The electronic circuit board according to claim 21, wherein said heat-resisting resin material is a polyimide resin.

23. A semiconductor package having a substrate assembly and a semiconductor mounted on said substrate assembly, said substrate assembly comprising:

a thick film circuit in the form of a ceramic circuit board; and first and second thin film circuits disposed one on each of opposite surfaces of said thick film circuit, wherein one such surface of said thick film circuit is electrically connected, via said first thin film circuit, to said semiconductor and the other, opposite surface thereof effect electrical connection, via said second thin film circuit, to an external circuit, and wherein said thin film circuits are made of a heat-resisting resin and a conducting material.

24. The semiconductor package according to claim 23, wherein said semiconductor includes at least one semiconductor chip, each one of said at least one semiconductor chip is electrically connected to said substrate assembly via solder bonding of connecting pads which are provided at contacting surfaces of said first thin film circuit and said semiconductor chip facing each other.

25. The semiconductor package according to claim 23, wherein said ceramic circuit board is comprised of a multi-layer laminate of a heat-resisting ceramic material and conductive material.

26. The semiconductor package according to claim 25, wherein said heat-resisting resin material is a polyimide resin.

27. An electronic circuit board in which a semiconductor package is mounted on an external circuit board, said package having a substrate assembly and a semiconductor mounted on said substrate assembly, and said substrate assembly comprising: a thick film circuit in the form of a ceramic circuit board; and first and second thin film circuits located one on each of opposite surfaces of said thick film circuit, wherein one such surface of said thick film circuit is electrically connected, via said first thin film circuit, to said semiconductor and the other, opposite surface thereof effect electrical connection, via said second film circuit, to an external circuit, and wherein said thin film circuits are made of a heat-resisting resin and a conductive material.

28. The electronic circuit board according to claim 27, wherein said external circuit board comprises a thick film circuit and a thin film circuit, said thin film circuit of said external circuit board being located on a surface of said thick film circuit thereof facing said semiconductor package.

29. The electronic circuit board according to claim 28, wherein said external circuit board comprises a thick film circuit and a pair of thin film circuits, one of said thin film circuits of said external circuit board being located on a first surface of said thick film circuit thereof facing said semiconductor package and the other one of said thin film circuits of said external circuit board being located on a second, oppositely facing surface of said thick film circuit thereof.

* * * * *